(12) United States Patent
Marizan et al.

(10) Patent No.: US 11,137,443 B2
(45) Date of Patent: Oct. 5, 2021

(54) SYSTEMS FOR PROBING SUPERCONDUCTING CIRCUITS INCLUDING THE USE OF A NON-MAGNETIC CRYOGENIC HEATER

(71) Applicant: Microsoft Technology Licensing, LLC, Redmond, WA (US)

(72) Inventors: Miriam E. Marizan, Baltimore, MD (US); Edward M. Kurek, Baltimore, MD (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 272 days.

(21) Appl. No.: 16/509,020

(22) Filed: Jul. 11, 2019

(65) Prior Publication Data
US 2021/0011082 A1    Jan. 14, 2021

(51) Int. Cl.
*H05K 1/02* (2006.01)
*G01R 31/317* (2006.01)
(Continued)

(52) U.S. Cl.
CPC ... *G01R 31/31702* (2013.01); *G01R 31/2875* (2013.01); *H05K 1/0201* (2013.01);
(Continued)

(58) Field of Classification Search
CPC .......... G01R 31/31702; G01R 31/2875; G01R 31/2884; H05K 1/181; H05K 2201/10022; H05K 2201/10151; H05K 2201/10325
See application file for complete search history.

(56) References Cited

U.S. PATENT DOCUMENTS

| | | | |
|---|---|---|---|
| 6,906,517 B1 * | 6/2005 | Huang | G01R 33/3856 324/315 |
| 7,436,182 B1 * | 10/2008 | Hudson | G01R 33/3403 324/318 |

(Continued)

OTHER PUBLICATIONS

Dotsenko, et al., "Integrated Cryogenic Electronics Testbed (ICE-T) for Evaluation of Superconductor and Cryo-Semiconductor Integrated Circuits", In Proceedings of IOP Conference Series: Materials Science and Engineering, vol. 171, Issue 1, Feb. 1, 2017, 9 Pages.

(Continued)

*Primary Examiner* — Dominic E Hawkins
(74) *Attorney, Agent, or Firm* — Ranjeev Singh; Singh Law, PLLC

(57) ABSTRACT

Systems for probing superconducting circuits, including using a non-magnetic cryogenic heater, are disclosed. A system including a circuit board having a socket and a heater, mounted on the socket, is provided. The heater includes a resistive element and an arrangement for connection with wires configured to supply a current to the resistive element, where the heater is non-magnetic. The system further includes an integrated circuit package, mounted on the socket, such that the heater is located between the socket and the package, where the integrated circuit comprises superconducting circuits having a first temperature corresponding to a superconducting transition temperature. The heater is configured to raise a temperature associated with the integrated circuit from a second temperature to the first temperature, where the second temperature is lower than the first temperature, and where each of the first temperature and the second temperature is a cryogenic temperature.

20 Claims, 4 Drawing Sheets

(51) Int. Cl.
*G01R 31/28* (2006.01)
*H05K 1/18* (2006.01)

(52) U.S. Cl.
CPC ... *H05K 1/181* (2013.01); *H05K 2201/10022* (2013.01); *H05K 2201/10151* (2013.01); *H05K 2201/10325* (2013.01)

(56) References Cited

U.S. PATENT DOCUMENTS

| | | | | |
|---|---|---|---|---|
| 2006/0290370 | A1* | 12/2006 | Lopez | G01R 31/2874 324/750.09 |
| 2014/0167795 | A1* | 6/2014 | Mayfield | G01R 31/2874 324/750.03 |
| 2017/0176260 | A1* | 6/2017 | Ferguson | H01L 23/34 |
| 2018/0102469 | A1* | 4/2018 | Das | H01L 39/2493 |

OTHER PUBLICATIONS

Gaidarenko, et al., "High Performance Packaging System for Superconducting Electronics", In Journal of IEEE Transactions on Applied Superconductivity, vol. 9, Issue 2, Jun. 1999, pp. 3668-3671.
"International Search Report & Written Opinion Issued in PCT Application No. PCT/US20/033504", dated Aug. 20, 2020, 14 Pages.
Yohannes, et al., "Parametric Testing of HYPRES Superconducting Integrated Circuit Fabrication Processes", In Journal of IEEE Transactions on Applied Superconductivity, vol. 17, Issue 2, Jun. 2007, pp. 181-186.

* cited by examiner

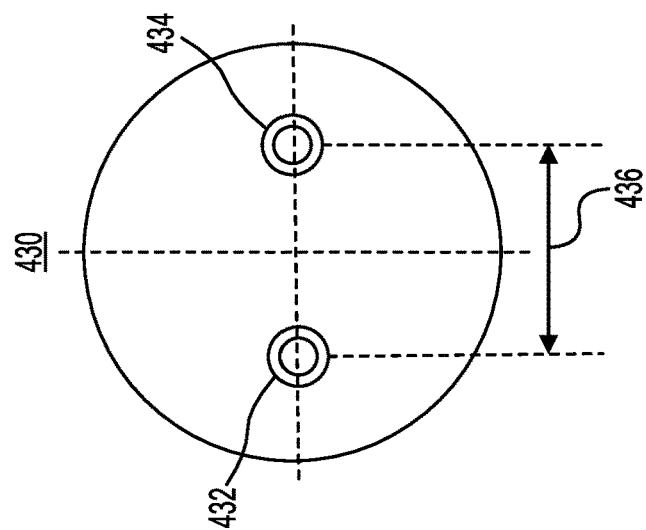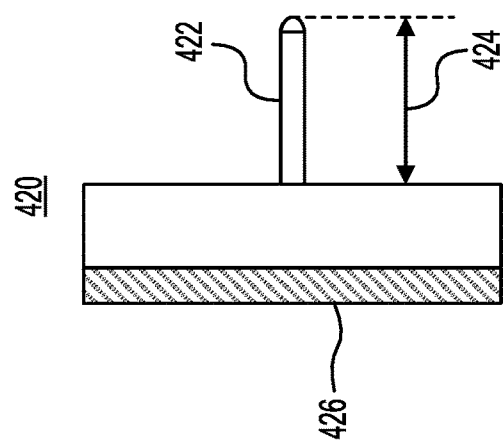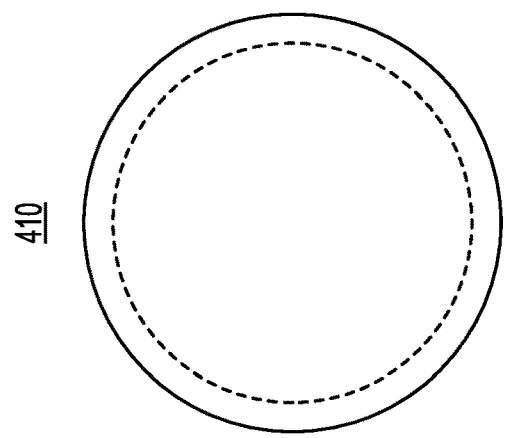
FIG. 4 ic circuits and systems. As
SYSTEMS FOR PROBING SUPERCONDUCTING CIRCUITS INCLUDING THE USE OF A NON-MAGNETIC CRYOGENIC HEATER

BACKGROUND

Semiconductor based integrated circuits used in electronic devices, such as digital processors, include digital circuits based on complimentary metal-oxide semiconductor (CMOS) technology. CMOS technology, however, is reaching its limits in terms of the device size. In addition, power consumption at high clock speeds by digital circuits based on the CMOS technology has increasingly become a limiting factor in high performance digital circuits and systems. As an example, servers in a data center are increasingly consuming large amounts of power. The consumption of power is partly the result of power loss from the dissipation of energy even when the CMOS circuits are inactive. This is because even when such circuits are inactive, and are not consuming any dynamic power, they still consume power because of the need to maintain the state of CMOS transistors.

An additional approach to the use of processors and related components, based on CMOS technology, is the use of superconducting logic-based components and devices. Superconducting logic-based circuits can also be used to process quantum information, such as qubits. Many superconducting logic circuits include Josephson junctions, which may be controlled using microwave signals.

SUMMARY

In one example, the present disclosure relates to a system including a circuit board having socket. The system may further include a heater, mounted on the socket, having a first surface and a second surface, where the first surface having a resistive element and the second surface having an arrangement for connection with wires configured to supply a current to the resistive element, where the heater is configured to be non-magnetic. The system may further include a package, comprising an integrated circuit, mounted on the socket, such that the heater is located between the socket and the package, where the integrated circuit comprises superconducting circuits having a first temperature corresponding to a superconducting transition temperature, and where the heater is configured to raise a temperature associated with the integrated circuit from a second temperature to the first temperature, where the second temperature is lower than the first temperature, and where each of the first temperature and the second temperature is a cryogenic temperature.

In another aspect, the present disclosure relates to a system including a printed circuit board having a first socket and a second socket. The system may further include a first heater, mounted on the first socket, having a first surface and a second surface, where the first surface having a first resistive element and the second surface having an arrangement for connection with wires configured to supply a current to the first resistive element. The system may further include a first package, comprising a first integrated circuit, mounted on the first socket, such that the first heater is located between the first socket and the first package, where the first integrated circuit comprises superconducting circuits having a first temperature corresponding to a superconducting transition temperature, and where the first heater is configured to raise a temperature associated with the first integrated circuit from a second temperature to the first temperature, where the second temperature is lower than the first temperature, and where each of the first temperature and the second temperature is a cryogenic temperature. The system may further include a second heater, mounted on the second socket, having a third surface and a fourth surface, where the fourth surface having a second resistive element and the fourth surface having an arrangement for connection with wires configured to supply a current to the second resistive element, and where each of the first heater and the second heater is configured to be non-magnetic. The system may further include a second package, comprising a second integrated circuit, mounted on the second socket, such that the second heater is located between the second socket and the second package, where the second integrated circuit comprises superconducting circuits having the first temperature corresponding to a superconducting transition temperature, and where the second heater is configured to raise a temperature associated with the second integrated circuit from the second temperature to the first temperature.

In yet another aspect, the present disclosure relates to a non-magnetic cryogenic heater. The non-magnetic cryogenic heater may include a first surface having a resistive element, where the resistive element comprises a non-magnetic alloy, and where the resistive element comprises a first conducting portion and a second conducting portion configured to carry a current, where the first conducting portion is configured to carry the current in a first direction and where the second conducting portion is configured to carry the current in the second direction opposite to the first direction. The non-magnetic cryogenic heater may further include a second surface, opposite to the first surface, having a first pin coupled to the first conducting portion and a second pin coupled to the second conducting portion.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

FIG. 4 shows three views of the non-magnetic cryogenic heater in accordance with one example.

DETAILED DESCRIPTION

Figure 1:
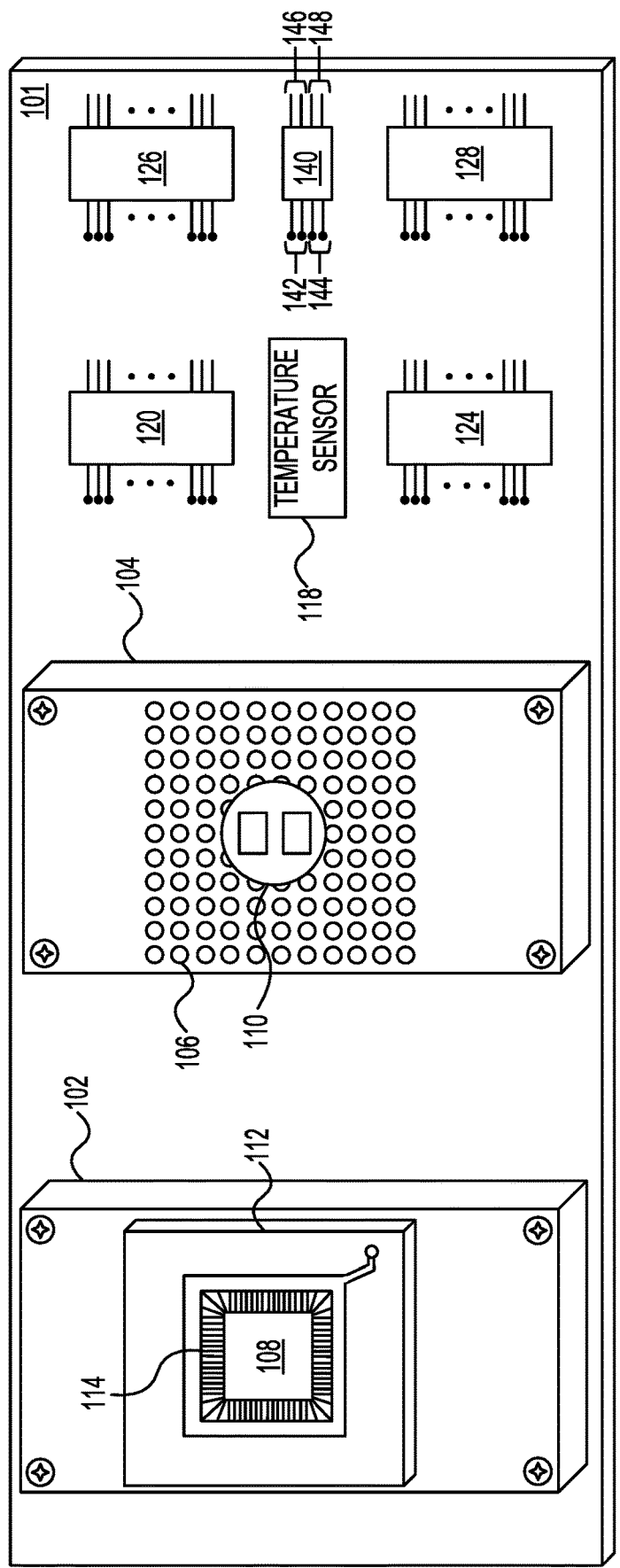
FIG. 1 is a block diagram of a system including a non-magnetic cryogenic heater in accordance with one example.

Examples described in this disclosure relate to systems for probing superconducting circuits including using a non-magnetic cryogenic package heater. Certain examples further relate to the use of the non-magnetic package heater as part of probe testing of packages including superconducting circuits. Superconducting circuits may use Josephson junctions to implement the functionality associated with the circuits. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the superconducting circuits. As an example, superconductors are materials that can carry a direct electrical current (DC) in the absence of an electric field. Superconductors have a critical temperature (Tc) below which they have zero resistance. Niobium, one such superconductor, has a critical temperature (Tc) of 9.3 Kelvin degrees. At temperatures below Tc, niobium is superconductive; however, at temperatures above Tc, it behaves as a normal metal with electrical resistance. Thus, in the SIS type of Josephson junction superconductors may be niobium superconductors and insulators may be $Al_2O_3$ barriers. In SIS type of junctions, the superconducting electrons are described by a quantum mechanical wave-function. A changing phase difference in time of the phase of the superconducting electron wave-function between the two superconductors corresponds to a potential difference between the two superconductors.

Various superconducting circuits including transmission lines can be formed by coupling multiple Josephson junctions by inductors or other components, as needed. Microwave pulses can travel via these transmission lines under the control of at least one clock. The microwave pulses can be positive or negative, or a combination thereof. The microwave pulses may have a frequency of up to 10 GHz or higher.

Certain examples further relate to the testing of reciprocal quantum logic (RQL) compatible superconducting circuits. In one example, the digital data may be encoded using a pair of positive and negative (reciprocal) single flux quantum (SFQ) pulses. As an example, a logical one bit may be encoded as a reciprocal pair of SFQ pulses generated in the positive and negative phases of a sinusoidal clock. A logical zero bit may be encoded by the absence of positive/negative pulse pairs during a clock cycle. The positive SFQ pulse may arrive during the positive part of the clock, whereas the negative pulse may arrive during the negative part of the clock.

Certain examples further relate to the testing of phase-mode logic based superconducting circuits. These superconducting circuits may also use phase-mode logic (PML) based devices. In the PML based devices, a logical '1' may be encoded as a phase high and a logical '0' may be encoded as a phase low. The transitions between phase high and phase low may be event-triggered by the SFQ pulses. In phase-mode logic based superconducting circuits, digital values may be encoded as Josephson junction (JJ) phase. A high phase may indicate a logic '1' and a low phase may indicate a logic '0.' Unlike the reciprocal quantum logic (RQL) encoding, these values are persistent across RQL clock cycles because there is no requirement for a reciprocal pulse to reset the JJ phase. As an example, if an AC clock, with four phases, were used to power the phase-mode logic superconducting circuit, the output of the phase-mode logic circuit may be persistent across all four phases of the AC clock. In one example, a four-phase clock may be derived from two AC clock sources. The four phases of the clock may provide directionality to the single flux quantum (SFQ) pulses. Thus, as an example, with respect to a four-phase clock, the positive pulse may ride the leading edge of the clock from one phase to the next and arrive at the output after one cycle of delay and the negative pulse may follow with half a cycle of separation. Other types of clocking arrangements, including clocking with more than four phases, may also be used.

The building blocks of both RQL-based superconducting circuits and PML-based superconducting circuits may include various types of logic gates. Example logic gates include an AND gate, an OR gate, a logical A-and-not-B (AanB) gate, and a logical AND & OR (AndOr) gate. The AanB gate may have two inputs and one output (Q). An input pulse A may propagate to output Q unless an input pulse B comes first. The AndOr gate may have two inputs and two outputs (Q1 and Q2). The first input pulse, input pulse A or input pulse B goes to output Q1 and the second input pulse goes to output Q2. The logical behavior of these gates may be based on the reciprocal data encoding mentioned earlier or on the phase-mode logic based data encoding as mentioned earlier.

FIG. 1 is a block diagram of a system 100 including a non-magnetic cryogenic heater 110 in accordance with one example. In this example, system 100 may include a printed circuit board (PCB) 101 with structures for mounting packages, circuit components, sensors, and connectors. System 100 may include sockets (e.g., socket 102 and socket 104) attached to PCB 101. A package (e.g., package 112) containing an integrated circuit (e.g., integrated circuit 108) may be mounted on any of the sockets. Integrated circuit 108 may be wire-bonded via wire bonds 114 to connectors on the package such that signals may be carried to and from integrated circuit 108 to PCB 101 and vice-versa. In this example, each of the packages may be a zero-insertion force (ZIF) package. As an example, system 100 shows a ZIF package 112 mounted on socket 102. A similar package may be mounted on socket 104. Each socket may include holes for receiving pins associated with the package. Thus, in this example, holes 106 formed in socket 104 may be configured to receive the pins associated with a package. The non-magnetic cryogenic heater 110 may include pins (e.g., two pins) and may be mounted on each of the sockets. In this example, non-magnetic cryogenic heater 110 is shown as mounted on socket 104. After non-magnetic cryogenic heater 110 is inserted into the holes associated with socket 104, the package grid array (PGA) carrying the integrated circuit may be pressed on top of non-magnetic cryogenic heater 110. Non-magnetic cryogenic heater 110 may be pressed between socket 104 and a package (e.g., a package similar to package 112) that is mounted on the socket. Thus, in this example, non-magnetic cryogenic heater 110 may be sandwiched between socket 104 and a package mounted via pins on to the socket. The package may include a grid array of pins and thus may be referred to as a Pin Grid Array (PGA) package.

With continued reference to FIG. 1, the pins associated with the non-magnetic cryogenic heaters are routed to circuit traces in PCB 101, each of which terminate at a PCB 101 mounted connector (e.g., connector 140) designated specifically for supplying current to the non-magnetic cryogenic heater. In this example, circuit traces may include a superconducting metal, such as niobium. Connector 140 may be configured to supply current to two non-magnetic cryogenic heaters. Thus, in this example, connector 140 may include PCB contacts 142 and pins 146 for connecting a wire carrying current for one of the non-magnetic cryogenic heaters (e.g., non-magnetic cryogenic heater 110). Connector 140 may also include PCB contacts 144 and pins 148 for connecting another wire carrying current for the other non-magnetic cryogenic heater. Non-magnetic cryogenic heater 110 is made of materials such as the heater does not interfere with the superconducting circuits' operation. The non-magnetic properties of the heater ensure that no magnetic fields are generated by the heater that could interfere with the superconducting circuits' operation.

Still referring to FIG. 1, PCB 101 may also include a temperature sensor 118, which may provide a measurement of the temperature associated with the environment of PCB 101. Thus, when PCB 101 is inserted into liquid helium, temperature sensor 118 may communicate the temperature to a display associated with system 100. PCB 101 may include additional connectors 120, 124, 126, and 128 for connecting various signals associated with probing integrated circuits being tested as part of system 100. Integrated circuit 108 may be any of one or more of a central processing unit, a graphics-processing unit, an artificial-intelligence processor, a field-programmable gate array, an application-specific integrated circuit, an application-specific standard product, a system-on-a-chip, a complex programmable logic device, a static random-access memory, a dynamic random-access memory, or a Josephson magnetic random-access memory. Although FIG. 1 shows a certain arrangement of components for probing integrated circuits PCB 101 may have other arrangements of components. In addition, PCB 101 may be configured such that additional or fewer integrated circuits may be tested at the same time. In addition, although FIG. 1 shows a specific type of a package, other types of packages may also be used as long as they can be heated in a similar fashion using non-magnetic cryogenic heater 110.

Figure 2:
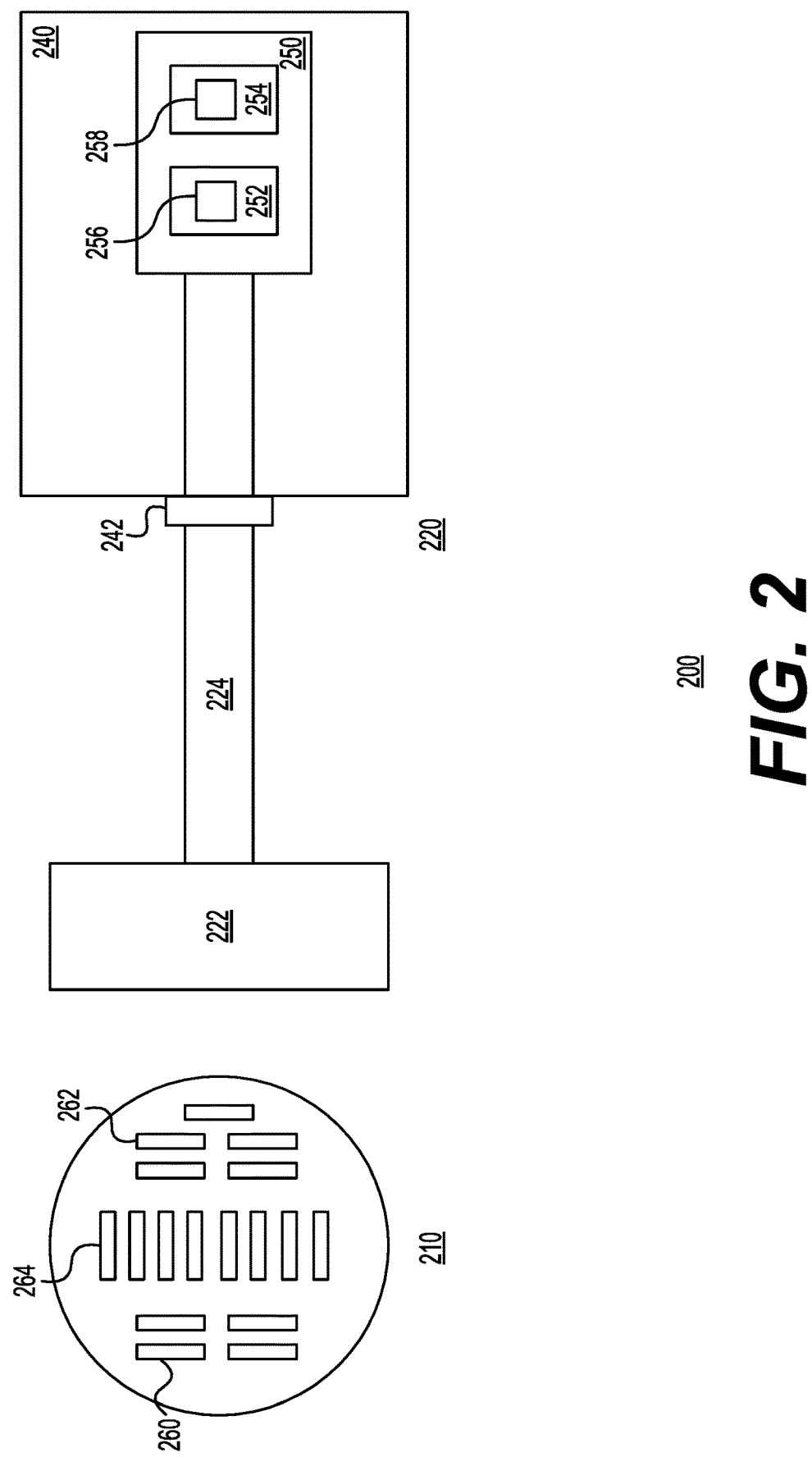
FIG. 2 shows a top view and a side view of a probe system in accordance with one example.

FIG. 2 shows a top view 210 and a side view 220 of a probe system 200. Top view 210 shows the top of bulkhead 222 of probe system 200. Bulkhead 222 may be the room temperature end of probe system 200. Bulkhead 222 may include several electrical connectors for connecting various instrumentation to probe system 200. In this example, bulkhead 222 may include D-subminiature (D-sub) connectors, including D-sub connectors 260, 262, and 264. In this example, bulkhead 222 may include two D-sub connectors per chip being probed.

With continued reference to FIG. 2, probe system 200 may include a tube 224 coupled to bulkhead 222. Tube 224 may be inserted into a housing 240. At least one circuit board (e.g., circuit board 250) may be coupled to a lower portion of tube 224. Wire harnesses (not shown) may run from bulkhead 222, through tube 224, and may be connected to the circuit board (e.g., the wire harnesses may be connected to connectors 120, 124, 126, and 128 of FIG. 1). The lower portion of tube 224 may be inserted into a housing 240, which may include liquid helium for cooling integrated circuits 256 and 258 (each of integrated circuits may be similar to integrated circuit 108 of FIG. 1) mounted on sockets 252 and 254, respectively. Housing 240 may be isolated from the ambient temperature by clamping housing 240 to tube 224 using clamp 242. Clamp 242 may provide thermal isolation, as well.

Still referring to FIG. 2, as described earlier, with respect to FIG. 1, non-magnetic cryogenic heaters may be sandwiched between the integrated circuit chips and the respective sockets. Housing 240 may be configured to provide a cryogenic environment with sufficiently low temperature (e.g., cryogenic temperature) to enable superconducting circuits included in the integrated circuit mounted on circuit board 250 to function. In this example, the term cryogenic temperature may refer to any temperature below 9 Kelvin. In one example, each of integrated circuits 256 and 258 may include superconducting circuits formed using niobium (a superconducting metal). In this example, housing 240 may be configured to provide a temperature that is approximately 4 Kelvin to allow the niobium-based superconducting circuits to function. Although FIG. 2 shows one circuit board (e.g., circuit board 250), additional circuit boards may be attached to tube 224, such that additional integrated circuits may be tested at the same time. Thus, in one example, four circuit boards may be attached to tube 224 and be arranged in housing 240. Assuming each circuit board has two integrated circuits, eight integrated circuits may be tested at the same time.

Advantageously, the heater is a modular design and it can be easily removed from the probe. In addition, because the heater is a removable heater, it can be replaced if it breaks without affecting other components. Moreover, unlike traditional heaters that may use a long phosphor bronze ribbon wire, the heater described in the present disclosure is small and can easily be inserted into the socket designed to receive a package grid array.

Figure 3:
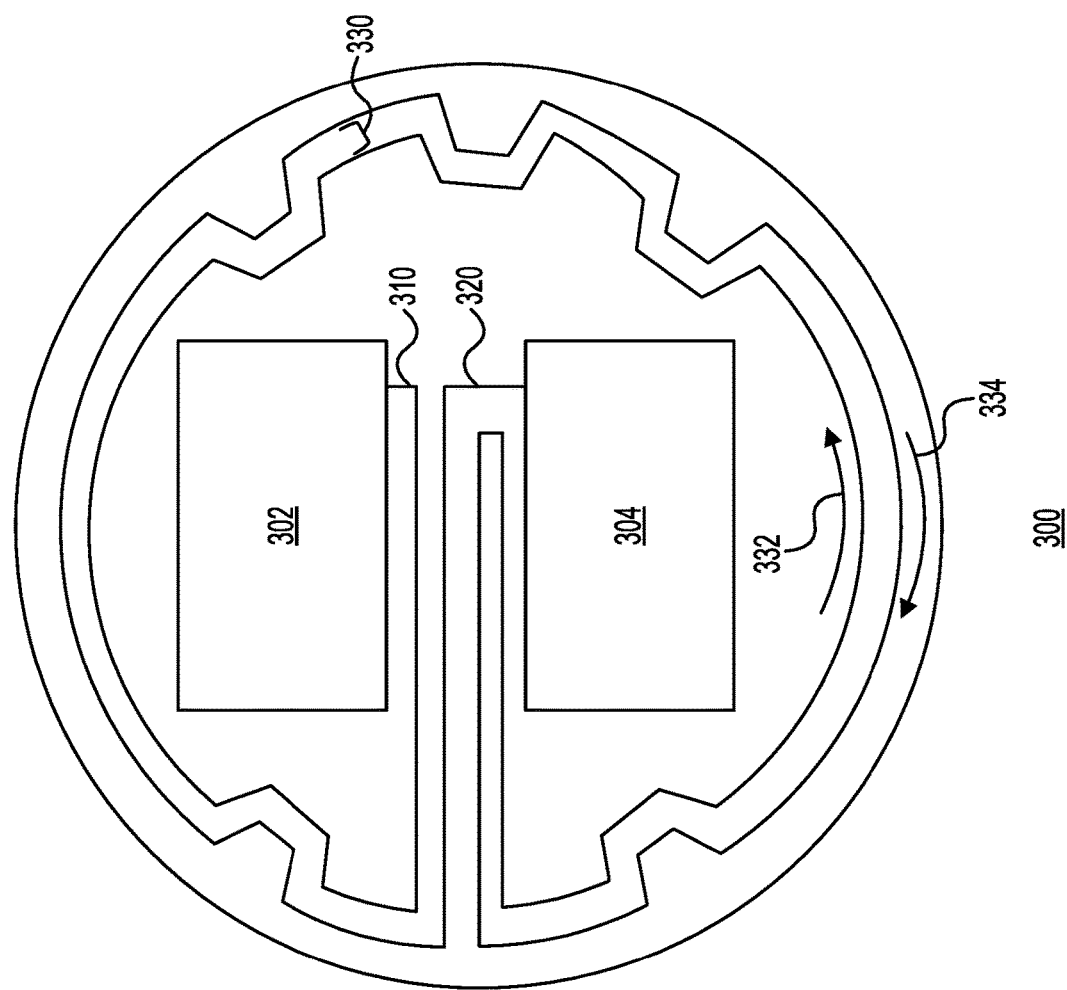
FIG. 3 shows a view of a resistive element including conductors in accordance with one example.

FIG. 3 shows a view of a resistive element 300 including conductors 310 and 320 in accordance with one example. Conductors 310 and 320 may be spaced from each other via a spacing 330. Conductor 310 may be coupled to a contact 302 and conductor 320 may be coupled to a contact 304. Contact 302 may further be coupled to one of the pins associated with the non-magnetic cryogenic heater (e.g., non-magnetic cryogenic heater 110 of FIG. 1). Contact 304 may be coupled to another one of the pins. The current may be supplied to resistive element 300 via conductors 310 and 320, each of which may serve as portions of resistive element 300. As shown in FIG. 3, the direction of current flow through conductor 310 may be one direction (indicated by arrow 332) and the direction of current flow through conductor 320 may be the opposite direction (indicated by arrow 334). The opposite directions of current flow may ensure the cancellation of any magnetic fields generated as a result of the current flow through the conductors. This may advantageously prevent any interference with the operation of the superconducting circuits included in the integrated circuits being probed. In addition, resistive element 300 may be formed using a non-magnetic alloy. In this example, resistive element 300 may be formed using Nichrome, an alloy comprising 80% nickel and 20% chromium. Any other suitable alloy, which is non-magnetic, and yet offers sufficient resistance to the current to enable the generation of heat, may be used. The length of each of conductors 310 and 320 may be selected such that the circuitous path is long enough to create sufficient resistance to allow for the heating. In this example, the target resistance may be approximately 27 Ohms.

FIG. 4 shows three views of a non-magnetic cryogenic heater 400 in accordance with one example. Top view 410 of the non-magnetic cryogenic heater shows a resistive element similar to resistive element 300 of FIG. 3. As shown by the hashed area 426, in a side view 420, the resistive element may have a certain thickness, as a result of the insulation (e.g., polyimide) and the resistive element disposed in the insulation. Side view 420 further shows a pin 422 attached to the bottom surface of non-magnetic cryogenic heater 400. The second pin is not shown, as it is hidden behind pin 422. Pin 422 may have a length 424, which may be selected based on a depth of the holes in the socket to be used with non-magnetic cryogenic heater 400. As shown in bottom view 430, non-magnetic cryogenic heater 400 may have two pins 432 and 434 spaced apart by a distance 436. In this example, distance 436 may be selected based on the distance between holes in the socket to be used with non-magnetic cryogenic heater 400.

In terms of the operation of probe testing, the circuit board (e.g., circuit board 250 of FIG. 2) may be lowered slowly into liquid helium to cool the integrated circuits to a temperature of approximately 4 Kelvin. Next, current may be supplied to the resistive element associated with the non-magnetic cryogenic heater to raise the temperature of the integrated circuits to approximately 9 to 10 Kelvin. In this example, the temperature range is selected based on the critical temperature associated with the superconducting circuits formed as part of the integrated circuits being probe-tested. After this step, the current supply to the heater may be reduced, such that the integrated circuits may be cooled back down to approximately 4 Kelvin. At this point, they could be tested. In this example, the integrated circuits may be cooled at a rate of 3 milli-Kelvin per second. In one example, the critical current associated with Josephson junctions of the superconducting circuits and the resistance associated with such circuits may be used to analyze the metal lines and vias inside the integrated circuit being tested.

In conclusion, the present disclosure relates to a system including a circuit board having socket. The system may further include a heater, mounted on the socket, having a first surface and a second surface, where the first surface having a resistive element and the second surface having an arrangement for connection with wires configured to supply a current to the resistive element, where the heater is configured to be non-magnetic. The system may further include a package, comprising an integrated circuit, mounted on the socket, such that the heater is located between the socket and the package, where the integrated circuit comprises superconducting circuits having a first temperature corresponding to a superconducting transition temperature, and where the heater is configured to raise a temperature associated with the integrated circuit from a second temperature to the first temperature, where the second temperature is lower than the first temperature, and where each of the first temperature and the second temperature is a cryogenic temperature.

The first temperature may be approximately 9 Kelvin and the second temperature may be approximately 4 Kelvin. The resistive element may include a first conducting portion coupled to a first wire selected from among the wires configured to supply the current to the resistive element and a second conducting portion coupled to a second wire selected from among the wires configured to supply the current to the resistive element. The first conducting portion may be configured to carry the current in a first direction and the second conducting portion may be configured to carry the current in the second direction opposite to the first direction. The resistive element may comprise a non-magnetic alloy.

A temperature sensor may be mounted on the circuit board, and the temperature sensor may be configured to monitor a temperature associated with the system. The integrated circuit may comprise at least one of a central processing unit, a graphics-processing unit, an artificial-intelligence processor, a field-programmable gate array, an application-specific integrated circuit, an application-specific standard product, a system-on-a-chip, a complex programmable logic device, a static random-access memory, a dynamic random-access memory, or a Josephson magnetic random-access memory.

In another aspect, the present disclosure relates to a system including a printed circuit board having a first socket and a second socket. The system may further include a first heater, mounted on the first socket, having a first surface and a second surface, where the first surface having a first resistive element and the second surface having an arrangement for connection with wires configured to supply a current to the first resistive element. The system may further include a first package, comprising a first integrated circuit, mounted on the first socket, such that the first heater is located between the first socket and the first package, where the first integrated circuit comprises superconducting circuits having a first temperature corresponding to a superconducting transition temperature, and where the first heater is configured to raise a temperature associated with the first integrated circuit from a second temperature to the first temperature, where the second temperature is lower than the first temperature, and where each of the first temperature and the second temperature is a cryogenic temperature. The system may further include a second heater, mounted on the second socket, having a third surface and a fourth surface, where the fourth surface having a second resistive element and the fourth surface having an arrangement for connection with wires configured to supply a current to the second resistive element, and where each of the first heater and the second heater is configured to be non-magnetic. The system may further include a second package, comprising a second integrated circuit, mounted on the second socket, such that the second heater is located between the second socket and the second package, where the second integrated circuit comprises superconducting circuits having the first temperature corresponding to a superconducting transition temperature, and where the second heater is configured to raise a temperature associated with the second integrated circuit from the second temperature to the first temperature.

The first temperature may be approximately 9 Kelvin and the second temperature may be approximately 4 Kelvin. The first resistive element may include a first conducting portion coupled to a first wire selected from among the wires configured to supply the current to the resistive element and a second conducting portion coupled to a second wire selected from among the wires configured to supply the current to the resistive element, and the second resistive element may comprise a third conducting portion coupled to a third wire selected from among the wires configured to supply the current to the second resistive element and a fourth conducting portion coupled to a fourth wire selected from among the wires configured to supply the current to the second resistive element.

The first conducting portion may be configured to carry the current in a first direction and the second conducting portion may be configured to carry the current in the second direction opposite to the first direction. The third conducting portion may be configured to carry the current in the first direction and the fourth conducting portion is configured to carry the current in the second direction. Each of the first resistive element and the second resistive element may comprise a non-magnetic alloy.

A temperature sensor may be mounted on the circuit board, and the temperature sensor may be configured to monitor a temperature associated with the system. Each of the first integrated circuit and the second integrated circuit may comprise at least one of a central processing unit, a graphics-processing unit, an artificial-intelligence processor, a field-programmable gate array, an application-specific integrated circuit, an application-specific standard product, a system-on-a-chip, a complex programmable logic device, a static random-access memory, a dynamic random-access memory, or a Josephson magnetic random-access memory.

In yet another aspect, the present disclosure relates to a non-magnetic cryogenic heater. The non-magnetic cryogenic heater may include a first surface having a resistive element, where the resistive element comprises a non-magnetic alloy, and where the resistive element comprises a first conducting portion and a second conducting portion configured to carry a current, where the first conducting portion is configured to carry the current in a first direction and where the second conducting portion is configured to carry the current in the second direction opposite to the first direction. The non-magnetic cryogenic heater may further include a second surface, opposite to the first surface, having a first pin coupled to the first conducting portion and a second pin coupled to the second conducting portion.

The non-magnetic alloy may comprise nickel and chromium. Each of the first conducting portion and the second conducting portion may be configured to provide resistance to the current to generate heat. The first conducting portion may be configured to carry the current in the first direction and the second conducting portion may be configured to carry the current in the second direction opposite to the first direction such that a first magnetic field generated by the current when flowing in the first direction is canceled by a second magnetic field generated by the current when flowing in the second direction.

Each of the first pin and the second pin may be configured to interface with a zero-insertion-force package. Each of the first pin and the second pin may be brazed to the second surface.

It is to be understood that the methods, modules, and components depicted herein are merely exemplary. Alternatively, or in addition, the functionality described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with the examples described in this disclosure can also include instructions stored in a non-transitory media. The term "non-transitory media" as used herein refers to any media storing data and/or instructions that cause a machine to operate in a specific manner. Exemplary non-transitory media include non-volatile media and/or volatile media. Non-volatile media include, for example, a hard disk, a solid-state drive, a magnetic disk or tape, an optical disk or tape, a flash memory, an EPROM, NVRAM, PRAM, or other such media, or networked versions of such media. Volatile media include, for example, dynamic memory, such as DRAM, SRAM, a cache, or other such media. Non-transitory media is distinct from, but can be used in conjunction with, transmission media. Transmission media is used for transferring data and/or instruction to or from a machine, such as processor 100. Example transmission media include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A system comprising:
   a circuit board having a socket;
   a heater, mounted on the socket, having a first surface and a second surface, wherein the first surface having a resistive element and the second surface having an arrangement for connection with wires configured to supply a current to the resistive element, wherein the heater is configured to be non-magnetic; and
   a package, comprising an integrated circuit, mounted on the socket, such that the heater is located between the socket and the package, wherein the integrated circuit comprises superconducting circuits having a first temperature corresponding to a superconducting transition temperature, and wherein the heater is configured to raise a temperature associated with the integrated circuit from a second temperature to the first temperature, wherein the second temperature is lower than the first temperature, and wherein each of the first temperature and the second temperature is a cryogenic temperature.

2. The system of claim 1, wherein the first temperature is approximately 9 Kelvin and the second temperature is approximately 4 Kelvin.

3. The system of claim 1, wherein the resistive element comprises a first conducting portion coupled to a first wire selected from among the wires configured to supply the current to the resistive element and a second conducting portion coupled to a second wire selected from among the wires configured to supply the current to the resistive element.

4. The system of claim 3, wherein the first conducting portion is configured to carry the current in a first direction and wherein the second conducting portion is configured to carry the current in the second direction opposite to the first direction.

5. The system of claim 1, wherein the resistive element comprises a non-magnetic alloy.

6. The system of claim 1, wherein a temperature sensor is mounted on the circuit board, and wherein the temperature sensor is configured to monitor a temperature associated with the system.

7. The superconducting computing system of claim 1, wherein the integrated circuit comprises at least one of a central processing unit, a graphics-processing unit, an artificial-intelligence processor, a field-programmable gate array, an application-specific integrated circuit, an application-specific standard product, a system-on-a-chip, a complex programmable logic device, a static random-access memory, a dynamic random-access memory, or a Josephson magnetic random-access memory.

8. A system comprising:
a printed circuit board having a first socket and a second socket;
a first heater, mounted on the first socket, having a first surface and a second surface, wherein the first surface having a first resistive element and the second surface having an arrangement for connection with wires configured to supply a current to the first resistive element;
a first package, comprising a first integrated circuit, mounted on the first socket, such that the first heater is located between the first socket and the first package, wherein the first integrated circuit comprises superconducting circuits having a first temperature corresponding to a superconducting transition temperature, and wherein the first heater is configured to raise a temperature associated with the first integrated circuit from a second temperature to the first temperature, wherein the second temperature is lower than the first temperature, and wherein each of the first temperature and the second temperature is a cryogenic temperature;
a second heater, mounted on the second socket, having a third surface and a fourth surface, wherein the fourth surface having a second resistive element and the fourth surface having an arrangement for connection with wires configured to supply a current to the second resistive element, and wherein each of the first heater and the second heater is configured to be non-magnetic; and
a second package, comprising a second integrated circuit, mounted on the second socket, such that the second heater is located between the second socket and the second package, wherein the second integrated circuit comprises superconducting circuits having the first temperature corresponding to a superconducting transition temperature, and wherein the second heater is configured to raise a temperature associated with the second integrated circuit from the second temperature to the first temperature.

9. The system of claim 8, wherein the first temperature is approximately 9 Kelvin and the second temperature is approximately 4 Kelvin.

10. The system of claim 8, wherein the first resistive element comprises a first conducting portion coupled to a first wire selected from among the wires configured to supply the current to the resistive element and a second conducting portion coupled to a second wire selected from among the wires configured to supply the current to the resistive element, and wherein the second resistive element comprises a third conducting portion coupled to a third wire selected from among the wires configured to supply the current to the second resistive element and a fourth conducting portion coupled to a fourth wire selected from among the wires configured to supply the current to the second resistive element.

11. The system of claim 10, wherein the first conducting portion is configured to carry the current in a first direction and wherein the second conducting portion is configured to carry the current in the second direction opposite to the first direction, and wherein the third conducting portion is configured to carry the current in the first direction and wherein the fourth conducting portion is configured to carry the current in the second direction.

12. The system of claim 10, wherein each of the first resistive element and the second resistive element comprises a non-magnetic alloy.

13. The system of claim 8, wherein a temperature sensor is mounted on the circuit board, and wherein the temperature sensor is configured to monitor a temperature associated with the system.

14. The superconducting computing system of claim 8, wherein each of the first integrated circuit and the second integrated circuit comprises at least one of a central processing unit, a graphics-processing unit, an artificial-intelligence processor, a field-programmable gate array, an application-specific integrated circuit, an application-specific standard product, a system-on-a-chip, a complex programmable logic device, a static random-access memory, a dynamic random-access memory, or a Josephson magnetic random-access memory.

15. A non-magnetic cryogenic heater comprising:
a first surface having a resistive element, wherein the resistive element comprises a non-magnetic alloy, and wherein the resistive element comprises a first conducting portion and a second conducting portion configured to carry a current, wherein the first conducting portion is configured to carry the current in a first direction and wherein the second conducting portion is configured to carry the current in the second direction opposite to the first direction; and
a second surface, opposite to the first surface, having a first pin coupled to the first conducting portion and a second pin coupled to the second conducting portion.

16. The non-magnetic cryogenic heater of claim 15, wherein the non-magnetic alloy comprises nickel and chromium.

17. The non-magnetic cryogenic heater of claim 15, wherein each of the first conducting portion and the second conducting portion is configured to provide resistance to the current to generate heat.

18. The non-magnetic cryogenic heater of claim 15, wherein the first conducting portion is configured to carry the current in the first direction and wherein the second conducting portion is configured to carry the current in the second direction opposite to the first direction such that a first magnetic field generated by the current when flowing in the first direction is canceled by a second magnetic field generated by the current when flowing in the second direction.

19. The non-magnetic cryogenic heater of claim 15, wherein each of the first pin and the second pin is configured to interface with a zero-insertion-force package.

20. The non-magnetic cryogenic heater of claim 15, wherein each of the first pin and the second pin is brazed to the second surface.

\* \* \* \* \*